(12) United States Patent
Xiu

(10) Patent No.: US 10,686,458 B1
(45) Date of Patent: Jun. 16, 2020

(54) METHOD AND APPARATUS FOR IMPROVING FREQUENCY SOURCE FREQUENCY ACCURACY AND FREQUENCY STABILITY

(71) Applicant: Liming Xiu, Plano, TX (US)

(72) Inventor: Liming Xiu, Plano, TX (US)

(73) Assignee: Liming Xiu, Plano, TX (US)

( * ) Notice: Subject to any disclaimer, the term of this patent is extended or adjusted under 35 U.S.C. 154(b) by 0 days.

(21) Appl. No.: 15/665,579

(22) Filed: Aug. 1, 2017

(51) Int. Cl.
  *H03K 4/26* (2006.01)
  *H03L 7/18* (2006.01)
  *H03L 7/099* (2006.01)
  *H03L 7/093* (2006.01)

(52) U.S. Cl.
  CPC ............... *H03L 7/18* (2013.01); *H03L 7/093* (2013.01); *H03L 7/099* (2013.01)

(58) Field of Classification Search
  USPC .................................................. 327/107–112
  See application file for complete search history.

(56) References Cited

U.S. PATENT DOCUMENTS

| | | | | |
|---|---|---|---|---|
| 6,104,252 A * | 8/2000 | Hofmann | ............... | H03L 1/026 327/105 |
| 6,329,850 B1 * | 12/2001 | Mair | ............... | G06F 1/025 327/105 |
| 7,065,172 B2 * | 6/2006 | Xiu | ............... | H03L 7/0996 327/147 |
| 7,406,144 B2 * | 7/2008 | Wang | ............... | H03C 3/0966 327/158 |
| 7,764,131 B1 * | 7/2010 | Seth | ............... | H03L 1/027 327/298 |
| 7,772,893 B2 * | 8/2010 | Chen | ............... | H03K 5/15013 327/105 |
| 8,120,389 B2 * | 2/2012 | Xiu | ............... | G06F 1/025 327/105 |
| 8,135,103 B1 * | 3/2012 | Courcy | ............... | H03L 7/197 348/537 |
| 8,664,988 B1 * | 3/2014 | Xiu | ............... | H03L 7/081 327/147 |
| 8,890,591 B1 * | 11/2014 | Xiu | ............... | H03L 1/022 327/147 |
| 9,054,921 B2 * | 6/2015 | Mayer | ............... | H04L 27/362 |
| 9,118,275 B1 * | 8/2015 | Xiu | ............... | G06F 1/08 |
| 9,379,714 B1 * | 6/2016 | Xiu | ............... | G04F 10/005 |
| 9,571,083 B2 * | 2/2017 | Rapinoja | ............... | H03K 5/159 |
| 9,621,173 B1 * | 4/2017 | Xiu | ............... | H03L 7/197 |
| 2003/0003887 A1 * | 1/2003 | Lim | ............... | H03L 7/085 455/147 |

(Continued)

*Primary Examiner* — Adam Houston

(57) ABSTRACT

A TAF-DPS based circuits and methods to improve electronic system's frequency accuracy and enhance its frequency stability is disclosed in this application. Present invention creates a circuit architecture and a calculation scheme for compensating frequency source's frequency error. Present invention further discloses a method of incorporating said scheme into functional chip built in either ASIC or FPGA fashion. Present invention further presents a method of using TAF-DPS-frequency-compensation-scheme-equipped-chips as nodes in electronic network. As a result, the circuit and apparatus disclosed in present invention can improve electronic system's performance from the time synchronization perspective.

20 Claims, 5 Drawing Sheets

(56) References Cited

U.S. PATENT DOCUMENTS

| | | | |
|---|---|---|---|
| 2005/0212604 A1* | 9/2005 | Cyr | H01L 24/48 331/16 |
| 2006/0212247 A1* | 9/2006 | Shimoyama | G06F 1/3203 702/89 |
| 2007/0104298 A1* | 5/2007 | Filipovic | H03J 7/10 375/344 |
| 2008/0042766 A1* | 2/2008 | Tarng | H03B 5/04 331/167 |
| 2009/0103604 A1* | 4/2009 | Xiu | H03L 7/0996 375/240.01 |
| 2009/0160493 A1* | 6/2009 | You | H04B 15/02 327/105 |
| 2010/0277246 A1* | 11/2010 | Seth | H03L 1/027 331/34 |
| 2011/0131439 A1* | 6/2011 | Renner | G06F 1/08 713/401 |
| 2011/0207453 A1* | 8/2011 | Hsu | H04W 88/06 455/424 |
| 2011/0285439 A1* | 11/2011 | Xiu | G06F 1/025 327/159 |
| 2012/0209558 A1* | 8/2012 | Wilcox | H03B 5/36 702/130 |
| 2012/0229171 A1* | 9/2012 | Xiu | G06F 1/025 327/107 |
| 2014/0197867 A1* | 7/2014 | Xiu | G06F 1/08 327/105 |
| 2015/0116015 A1* | 4/2015 | Toriumi | G06F 1/10 327/147 |
| 2015/0288368 A1* | 10/2015 | Yun | H03L 7/083 331/18 |
| 2016/0191195 A1* | 6/2016 | Magri | H04J 14/02 398/79 |
| 2016/0360602 A1* | 12/2016 | Cheung | H05H 1/30 |
| 2017/0072811 A1* | 3/2017 | Tabatowski-Bush | B60L 11/1861 |
| 2017/0194971 A1* | 7/2017 | Yonezawa | H03L 7/095 |
| 2018/0102180 A1* | 4/2018 | Meacham | G11C 27/026 |

* cited by examiner

METHOD AND APPARATUS FOR IMPROVING FREQUENCY SOURCE FREQUENCY ACCURACY AND FREQUENCY STABILITY

FIELD OF THE INVENTION

The present invention generally relates to the field of integrated circuit. More specifically, embodiments of the present invention pertain to circuits and methods of improving frequency source's frequency accuracy and frequency stability using Time-Average-Frequency Direct Period Synthesis (TAF-DPS) as the underlying technology.

DISCUSSION OF THE BACKGROUND

Clock signal is the most important electrical signal. It directly links to the thing called "time", which is used to coordinate events inside electronic world. Clock signal is generated from frequency source. Frequency source is found in electronic systems from military, metrology, industrial, consumer, communication networks, automotive, power grid, banking and scientific project. Taking telecommunication industry for example, GPS provided timing supports a variety of applications: a frequency source of $1 \cdot 10^{-11}$ accuracy functions as a primary reference clock for Switched Telephone Networks (STN); time synchronization of microsecond accuracy is used in Cellular Telephone System to synchronize cell sites for allowing seamless switching; Network Time Protocol (NTP) uses millisecond accuracy to support application level usage of accurate time while Precise Timing Protocol (PTP) uses sub-microsecond. IP based applications like streaming audio & video need solid frequency sources for delivering good timing information.

Inside electronic system, clock derives time from frequency. A typical clock system includes a frequency source and a counting circuit (for counting, setting and synchronization). There are two concepts when clocks are used to coordinate events among systems: synchronization and syntonization. Clocks are synchronized when they are agreed in time. Clocks are syntonized when their oscillators have the same frequency. No clock can ever keep perfect time since all oscillators exhibit random and systematic errors. Clock error can be expressed in (1) where T(t) is the time difference between two clocks at time t after synchronization, $T_0$ is synchronization error at t=0, R(t) is the frequency difference between the two clocks' oscillators, ε (t) is the error due to random fluctuations.

$$T(t)=T_0+\int_0^t R(t)dt+\varepsilon(t) \quad (1)$$

When compared with ideal frequency source, the frequency value of a real source always deviates from the specified value. This imperfection, which is caused by the combined effect of manufacture error, temperature variation, aging, loading shift, is often referred as frequency instability. Commercially there are various types of frequency sources available for choosing, from a few cents XO to a few hundred dollars TCXO (temperature-control crystal) to a few thousand dollars OCXO (oven-controlled crystal). Their performances vary greatly: from XO's tolerance of 10~100 ppm, to TCXO's~1 ppm, to OCXO's~0.1 ppm.

Equation (1) relates frequency error to time error. In many cases, frequency error is caused by frequency instability. In this application the term frequency accuracy is used to represent, in the frequency value of a given frequency source, the difference between actual value and the value specified in its specification. The term frequency stability is used to describe its capability of maintaining its frequency accuracy under the influence of disturbances. The major causes of frequency instability are: temperature step, aging, vibration, shock, oscillator on/off switching and etc. In high performance system, TCXO, or even OCXO, are adopted. Those high quality sources usually have much better frequency stability than low end crystals. The drawback however is the extreme high cost. Out of the causes mentioned above, the frequency instabilities due to temperature and aging can potentially be compensated. Commercial examples for compensating temperature induced instability are available. An example is given in [1] where temperature sensor is used to report temperature reading and built-in fractional-N or integer-N PLL is used to counteract the corresponding frequency deviation. Its resolution of frequency correction is in the range of hundreds Hz. The compensation however is for the particular functional clock (the RF carrier) and the circuit is custom designed. It is hard to be applied to general case.

Time-Average-Frequency Direct Period Synthesis (TAF-DPS) is an emerging frequency synthesis technique [2-3]. Its distinguishing features are small frequency granularity (termed as arbitrary frequency generation) and fast frequency switching (termed as instantaneous frequency switching). Experiment evidence is available to support the claim that its frequency granularity can reach the level of a few ppb [4]. In present application, TAF-DPS is used to develop a scheme for compensating frequency error and improve frequency source's frequency accuracy and frequency stability.

In 2008, a novel concept, Time-Average-Frequency (TAF), is proposed [2]. It removes the constraint that all the cycles in a clock pulse train have to be equal in their length-in-times. As a result, a TAF clock signal can be created by using two, or more, types of cycles. Small frequency granularity can be obtained by adjusting the weighing factor in very fine step. Fast frequency switching is accomplished through directly synthesizing the length of each individual clock pulse. Together, a new technology, Time-Average-Frequency Direct Period Synthesis, is emerged [3]. Its aim is to provide the features of arbitrary frequency generation and instantaneous frequency switching to chip designers and system users.

The important features of arbitrary frequency generation and instantaneous frequency switching enabled by TAF-DPS clock generator are extremely useful for future electronic system designs. They are the enabler for future innovations. In current application those features are used to construct a scheme for improving frequency source's frequency accuracy and frequency stability by compensating frequency error due to temperature deviation, component aging and other disturbances.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY OF THE INVENTION

It is therefore an object of the present invention to use the TAF-DPS technology for developing a frequency compensation circuit. It is a further object of the present invention to use said TAF-DPS based circuit for improving frequency source's frequency accuracy and frequency stability.

The present invention relates to circuits and methods of using TAF-DPS technology for developing a frequency tuning circuit. Thus, the present invention can take advantage of the excellent frequency generation capability provided by TAF-DPS. As a result, when TAF-DPS frequency compensation scheme is incorporated in electronic systems, a vast majority of such system can benefit from better time synchronization quality in their operations due to higher frequency accuracy and better frequency stability.

DETAILED DESCRIPTION

Figure 1:
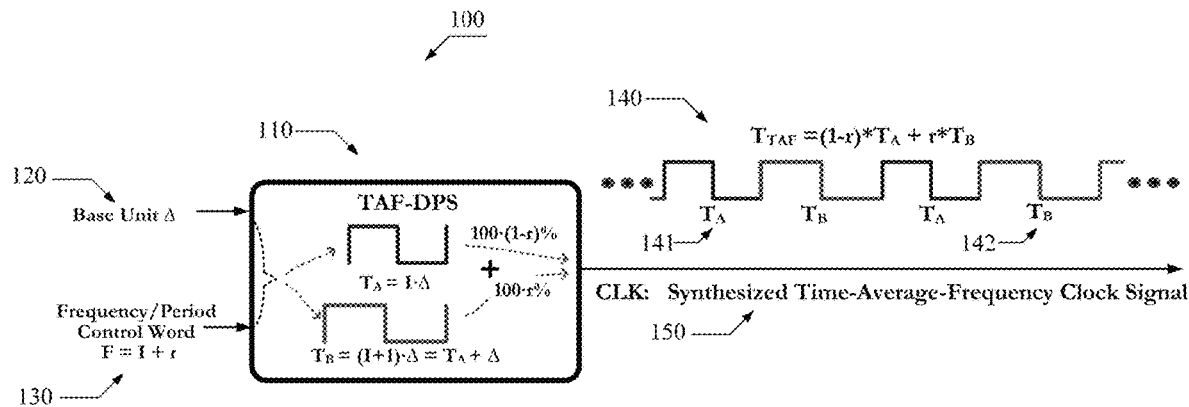
FIG. 1 is an electrical diagram, in block form, showing the general principle of TAF-DPS.

Reference will now be made in detail to various embodiments of the invention, examples of which are illustrated in the accompanying drawings. While the invention will be described in conjunction with the following embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions that follow are presented in terms of processes, procedures, logic blocks, functional blocks, processing, and other symbolic representations of operations on data bits, data streams or waveforms within a computer, processor, controller and/or memory. These descriptions and representations are generally used by those skilled in the arts of VLSI-circuit-and-system design to effectively convey the substance of their work to others skilled in the art. A process, procedure, logic block, function, process, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

It should be borne in mind, however, that all of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "determining," "manipulating," "transforming," "displaying", "compensating", "correcting", "calibrating" or the like, refer to the action and processes of a computer or signal processing system, or similar processing device (e.g., an electrical, optical, or quantum computing or processing device), that manipulates and transforms data represented as physical (e.g., electronic) quantities. The terms refer to actions and processes of the processing devices that manipulate or transform physical quantities within the component(s) of a system or architecture (e.g., registers, memories, flip-flops, other such information storage, transmission or display devices, etc.) into other data similarly represented as physical quantities within other components of the same or a different system or architecture.

Furthermore, for the sake of convenience and simplicity, the terms "clock," "time," "rate," "period," "frequency" and grammatical variations thereof are generally used interchangeably herein, but are generally given their art-recognized meanings. Also, for convenience and simplicity, the terms "data," "data stream," "waveform" and "information" may be used interchangeably, as may the terms "connected to," "coupled with," "coupled to," and "in communication with" (each of which may refer to direct or indirect connections, couplings, and communications), as may the terms "electrical path," "channel," "wire" (each of which may refer to a physical channel for transferring electrical signal), as may the terms "signal," "pulse," "pulse train," "a sequence of digital data" (each of which may refer to an electrical signal that has only two values: zero and one), as may the terms "input," "input port," "input pin" (each of which may refer to a physical channel for receiving data), as may the terms "output," "output port," "output pin" (each of which may refer to a physical channel for sending data), as may the terms "frequency resolution," "frequency granularity," (each of which may refer to the smallest frequency step), as may the terms "frequency compensation," "frequency correction," (each of which may refer to the action of making circuit's output frequency closer to the specified target value), but these terms are also generally given their art-recognized meanings.

Architecture and Circuit of TAF-DPS Based Frequency Compensation Scheme

Referring now to FIG. 1, the principle of TAF-DPS architecture 100 will be explained. A TAF-DPS frequency synthesizer 110 has two inputs: a first input for taking a base time unit Δ 120 and a second input for taking a frequency/period control word 130 F=I+r where I is an integer of greater than one and r is a fraction of 0≤r<1. TAF-DPS frequency synthesizer 110 has one output CLK 150. It outputs the synthesized Time-Average-Frequency clock signal. Starting from the base unit Δ 120, the TAF-DPS frequency synthesizer creates two types of cycles $T_A=I·Δ$ and $T_B=(I+1)·Δ$. Its output CLK is a clock pulse train 140 that consists of the type of cycles $T_A$ 141 and $T_B$ 142. They are used in an interleaved fashion. The fraction r represents the occurrence possibility of cycle type $T_B$ (and thus $T_A$).

Figure 2:
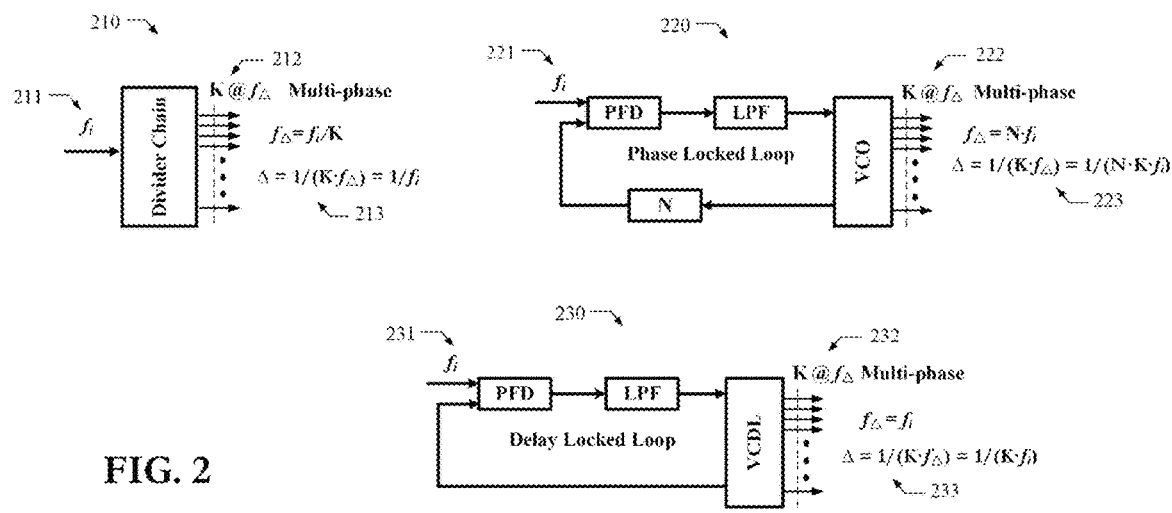
FIG. 2 is an electrical diagram, in block form, showing various methods of creating base time unit Δ.

The base unit Δ 120 is generated from a plurality of phase-evenly-spaced signals. Referring now to FIG. 2, a plurality of phase-evenly-spaced signals can be created from a divider chain, a VCO (voltage controlled oscillator) that is locked to a reference through a PLL (Phase Locked Loop) or a VCDL (Voltage Controlled Delay Line) that is locked to an input through a DLL (Delay Locked Loop). In divider chain 210, an input signal of frequency $f_i$ 211 is frequency divided by a chain of dividers. It results in a plurality of K phase-evenly-spaced signals of frequency $f_Δ$ 212. $f_Δ=f_i/K$ when a Johnson counter of K/2 stages is used to make the divider chain for example. The value of base time unit Δ 213 is the time span between any two logically adjacent signals of said plurality of K phase-evenly-spaced signals. It is $Δ=T_A/K=1/(K·f_Δ)=1/f_i$ in the case of Johnson counter. In the case of PLL 220, the VCO 222 is locked to an input reference of frequency $f_i$ 221 through a divide-by-N divider. The VCO outputs a plurality of K phase-evenly-spaced signals of frequency $f_Δ$ 222 and $f_Δ=N·f_i$. The value of base time unit Δ 223 is the time span between any two logically adjacent signals of said plurality of K phase-evenly-spaced signals. And in this PLL case it is $Δ=T_A/K=1/(K·f_Δ)=1/(K·N·f_i)$. In the case of DLL 230, the VCDL is locked to an input signal with frequency $f_i$ 231. The VCDL outputs a plurality of K phase-evenly-spaced signals of frequency $f_Δ$ 232 and $f_Δ=f_i$. The value of base time unit Δ 233 is the time span between any two logically adjacent signals of said plurality of K phase-evenly-spaced signals and in this DLL case it is $Δ=T_A/K=1/(K·f_Δ)=1/(K·f_i)$.

Figure 3:
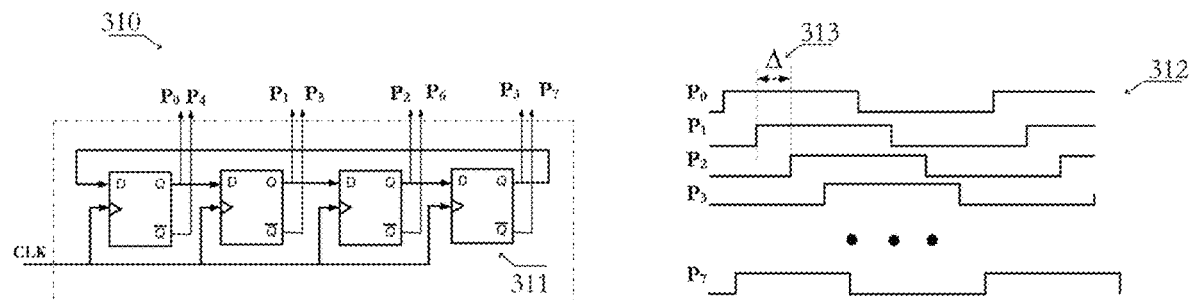
FIG. 3 is an electrical diagram, in block form, showing an embodiment of generating base time unit.

Refer now to FIG. 3, an exemplary embodiment of using divider chain to create base time unit Δ is described. Standard cells in an ASIC (Application Specific Integrated Circuit) library or configurable blocks in a FPGA (Field Programmable Gate Array) system are configured to create a Johnson counter 310 which comprises a plurality of D-type flip-flops 311 driven by a clock signal. Said flip-flops are connected in series to form a loop. The non-inverting data output of each D-type flip-flop is connected to the data input of the flip-flop which is logically next to said flip-flop. The non-inverting output of the last flip-flop in the series is connected to the input of the first flip-flop in the series. Both the non-inverting and inverting outputs of each said D-type flip-flop are used as Johnson counter's outputs. The outputs from all said flip-flops form a plurality of phase-evenly-spaced signals (the timing mismatch between the non-inverting and inverting outputs is assumed small and is ignored). The time span between any two logically adjacent said signals is the base time unit Δ. In FIG. 3, an example of 4-stage Johnson counter consisting of four flip-flops is illustrated. Four D-type flip-flops 311 are connected in series. A plurality of eight phase-evenly-spaced signals 312 is resulted (K=8 in this example). Base time unit Δ 313 is formed from the time span between any two logically adjacent said signals.

Figure 4:
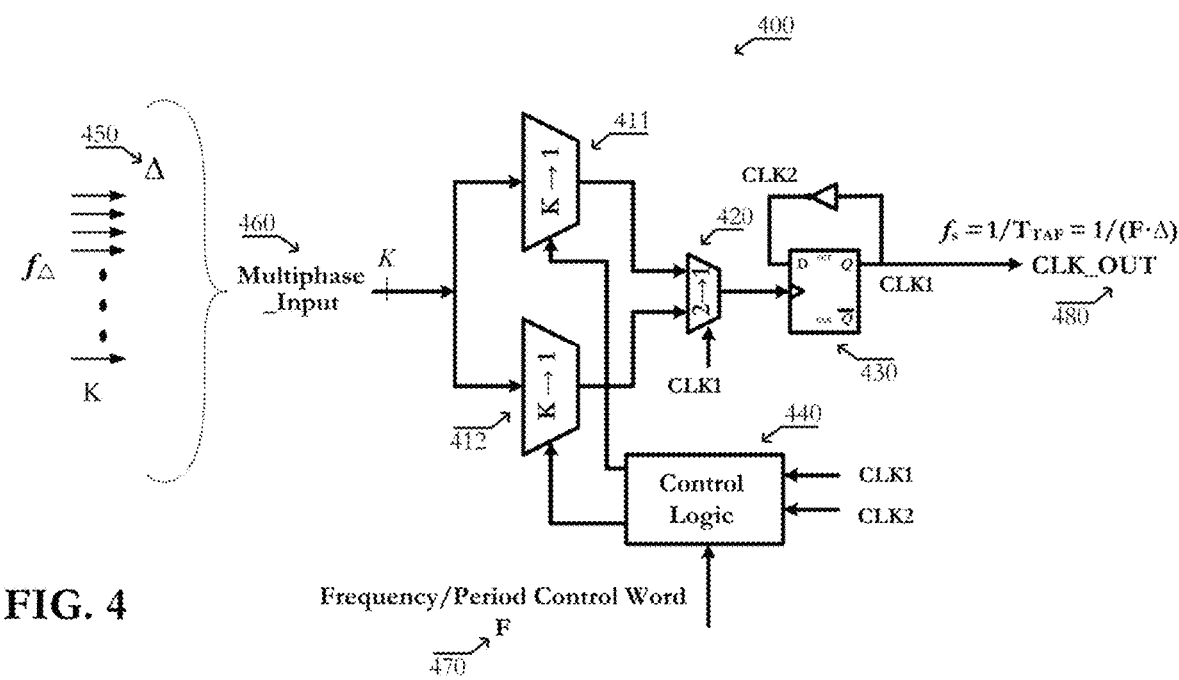
FIG. 4 is an electrical diagram, in block form, showing the circuit structure of TAF-DPS.

Referring now to FIG. 4, the internal circuit structure of TAF-DPS frequency synthesizer will now be described. A TAF-DPS frequency synthesizer 400 comprises two K→1 multiplexers 411 and 412, a 2→1 multiplexer 420, a D-type flip-flop configured as toggle flip-flop 430 and a control logic block 440. The TAF-DPS frequency synthesizer 400 takes signal Multiphase_Input 460 as an input. Multiphase_Input 460 has K signals of evenly-spaced phases with frequency $f_Δ$. The time span between any two logically adjacent phases is Δ 450 and it is calculated as $Δ=T_A/K=1/(K·f_Δ)$. The TAF-DPS frequency synthesizer 400 takes signal F 470 as the input to control its output frequency (or period). The TAF-DPS frequency synthesizer 400 has an output signal CLK_OUT 480 that outputs a clock signal with frequency $f_s$.

The TAF-DPS frequency synthesizer output's period can be calculated as $T_{TAF}=F·Δ$. The control word F can take value in the range of [2, 2K], fraction included. When only integer is used in control word F, the TAF-DPS output is a signal of conventional frequency (i.e. only one type of cycle is used in the clock pulse train). When control word F has fractional part, the TAF-DPS uses Time-Average-Frequency concept in its output signal (i.e. more than one type of cycles can be used in the clock pulse train). The Time-Average-Frequency concept is explained in chapter 3 of reference [3]. The working principle of TAF-DPS can be found in chapter 4 of reference [3]. TAF-DPS frequency synthesizer 400 can function as the circuit block 110 in FIG. 1. The signal F 470 functions as the control word F 130 in FIG. 1. The signal CLK_OUT 480 functions as the signal CLK 150 in FIG. 1.

The signal CLK_OUT 480 output frequency $f_s$ can be calculated using (2) (please see chapter 4 of reference [3]). When divider chain 210 of FIG. 2 is used as the circuit for generating base time unit Δ, equation (3) can be derived from (2). When PLL 220 of FIG. 2 is used as the circuit for generating base time unit Δ, equation (4) can be derived from (2). When DLL 230 of FIG. 2 is used as the circuit for generating base time unit Δ, equation (5) can be derived from (2).

$$Δ=T_A/K=1/(K·f_Δ), f_s=1/T_{TAF}=1/(F·Δ)=(K/F)·f_Δ \quad (2)$$

$$f_Δ=f_i/K, Δ=1/f_i \rightarrow f_s=f_i/F \quad (3)$$

$$f_Δ=N·f_i, Δ=1/(K·N·f_i) \rightarrow f_s=(K·N/F)·f_i \quad (4)$$

$$f_Δ=f_i, Δ=1/(K·f_i) \rightarrow f_s=(K/F)·f_i \quad (5)$$

Figure 5:
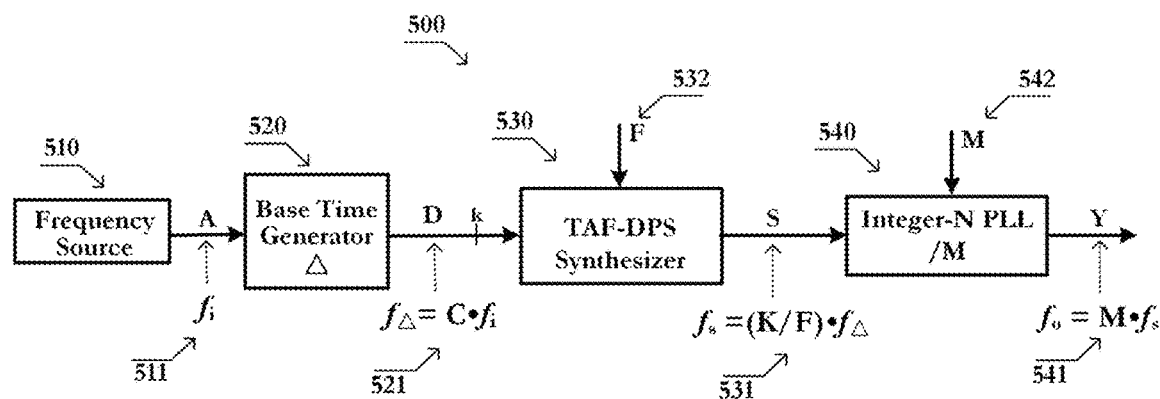
FIG. 5 is an electrical diagram, in block form, showing the circuit architecture of present invention of TAF-DPS frequency compensation scheme.

Referring now to FIG. 5, the circuit architecture for frequency compensation of present invention will be described. System 500 is the architecture of the frequency compensation scheme. Frequency source 510 represents a frequency source, which can be any type of frequency source generating electrical oscillation such as a crystal oscillator. It is used in electronic system as the frequency reference. Frequency source 510 has a target value (e.g. 100 MHz) which represents the desirable value in an ideal condition excluding manufacture error and all disturbances such as temperature step, vibration, shock, aging, short term noise, on/off switching and others. In real operating environment, however, 510 frequency source's output frequency $f_i$ 511 will deviate from the target value due to manufacture error and aforementioned disturbances. Base time generator 520, TAF-DPS synthesizer 530 and integer-N PLL 540 are used to compensate (or to correct) the off-target frequency value and bring it back to the target value.

Frequency source's 510 output A is fed into the base time unit 520 to generate a plurality of K phase-evenly-spaced signals D with frequency $f_\Delta$ 521. The time span between any two logically adjacent signals of said plurality of K phase-evenly-spaced signals is the base time unit Δ. Said signal A can be the signal 211, or 221, or 231 in FIG. 2. From equation (3), (4) and (5), frequency $f_\Delta$ 521 can be related to frequency $f_i$ 511 by $f_\Delta = C \cdot f_i$ where C is a constant.

Said signal D from base time generator 520 is fed into TAF-DPS synthesizer 530. Synthesizer 530 has an output S whose frequency $f_s$ 531 is controlled by frequency control word F 532. From equation (2), frequency $f_s$ 531 can be related to frequency $f_\Delta$ 521 by $f_s = (K/F) \cdot f_\Delta$. Signal S is inputted into integer-N PLL 540 with a dividing ratio M 542. 540 PLL's output Y has a frequency of $f_o$ 541. Frequency $f_o$ 541 can be related to frequency $f_s$ 531 by $f_o = M \cdot f_s$. Equation (6) is therefore derived, which relates the frequency $f_o$ of the final output Y to frequency $f_i$ of the frequency source's output A. From equation (3), (4) and (5), it is derived that C=1/K for the case of using divider chain to implement base time generator 520, and C=N for the case of PLL, and C=1 for the case of DLL. Therefore, equation (7), (8) and (9) are resulted for the cases of divider chain, PLL and DLL, respectively.

$$f_o = M \cdot f_s = (K \cdot M/F) \cdot f_\Delta = (K \cdot M \cdot C/F) \cdot f_i \quad (6)$$

$$f_o = (M/F) \cdot f_i, \ C=1/K, \text{Divider Chain} \quad (7)$$

$$f_o = (K \cdot N \cdot M/F) \cdot f_i, \ C=N, \text{PLL} \quad (8)$$

$$f_o = (K \cdot M/F) \cdot f_i, \ C=1, \text{DLL} \quad (9)$$

From equation (7), (8) and (9), $f_o/f_i$ can be expressed as $f_o/f_i = L/F$ where L is a constant. The control word F has both integer and fraction parts: $F = I + r = I \cdot (1 + r/I)$ where r can take either positive or negative value and $|r| \le 0.5$ (this is mathematically equivalent to the description presented in where r is treated as a positive number of $0 \le r < 1$). Therefore, equation (10) can be derived. By properly setting the r and I values, desirable value for $f_o/f_i$ can be achieved.

$$f_o/f_i = L/F = L/[I \cdot (1+r/I)] = (L/I) \cdot [1 - r/I + (r/I)^2 - (r/I)^3 + \ldots] \quad (10)$$

If $f_o/f_i$ is expressed as $f_o/f_i = (1+x)$, then x can be regarded as the required amount of frequency compensation (or correction) for making $f_o = f_{target}$ where $f_{target}$ is the target value. In (10), L can be set to any value for user's preference. However, for compensating the frequency error of a frequency source, it is usually set as L=I. Therefore, to the first order, we have equation (11). Equation (11) can be used to help user set the value for I and r. The accuracy of the frequency compensation is to the first order, which is applicable for most real applications since the value of r/I is much smaller than 1% in most practical cases.

$$x \approx -r/I \quad (11)$$

If, in general, we use $f_{target}$ to denote 510 frequency source's target frequency value and $f_i$ to denote 510 frequency source's actual output frequency value, equation (12) can represent the relationship between the two values where x is the required amount of correction (i.e. the amount of off-target error). The purpose of the architecture 500 of current invention is to make $f_o = f_{target}$. For this reason, to perform the frequency compensation task to first order accuracy, $r/I = -x$ is used to set the parameters I and r. In operation, I is determined first. Thus, r is subsequently set as $r = -x \cdot I$. When parameters I and r are set using this method, the final output frequency $f_o$ 541 and the frequency source's original output frequency $f_i$ are related by (13). Equation (13) is good to the first order. Equation (14) is used for accuracy of second order. The value of r can be found from the roots of equation: $r^2 - r \cdot I - x \cdot I^2 = 0$. This root of $r = (I/2)(1 - \sqrt{1+4x})$ will be the solution for meeting the accuracy of second order. For person of ordinary skill in the art, higher order of accuracy can be achieved by using more terms in equation (10).

$$f_{target} = (1+x) \cdot f_i \quad (12)$$

$$x = -r/I, \ f_o/f_i = 1 - r/I, \text{first order} \quad (13)$$

$$x = -r/I + (r/I)^2, \ f_o/f_i = 1 - r/I + (r/I)^2, \text{second order} \quad (14)$$

The following example is helpful to understand this frequency compensation scheme. Assume the frequency source is a 100 MHz crystal (target value is $f_{target}$=100 MHz). At one moment, the measured value is $f_i$=99.9997637416 MHz which is about 2.36 ppm (2.362589581·10$^{-6}$, or ~236 Hz) off target. A divider chain (please refer to FIG. 3) is used to implement the base time generator. The present invention of 500 (please refer to FIG. 5) is used to compensate this frequency offset. If the 540 PLL's M is taken as 16 and the TAF-DPS frequency control word F is set as F=15.999962198566704 (I=16, r=−0.000037801433296), according to (7), the final output $f_o$ is calculated as $f_o$=(16/15.999961853027343) ·99.9997637416=100.0000000005581 MHz. Hence, the frequency error has been reduced from 2.36 ppm to virtually none.

For some applications, the target frequency $f_{target}$ might be higher or lower than the input $f_i$. In other words, the ratio is $f_{target}/f_i$=P or $f_{target}/f_i$=1/P where P is a value of greater than one. In those cases, $f_o/f_i$ is expressed as $f_o/f_i$=(P+x) for $f_{target} > f_i$ and $f_o/f_i$=(1/P+x) for $f_{target} < f_i$. And x can be still regarded as the required amount of frequency compensation (or correction) for making $f_o = f_{target}$. In those cases, equation (10) can also be used to calculate the required x value.

An Atlys™ FPGA system is used to verify the architect 500 of present invention. The Atlys circuit board is a complete, ready-to-use digital circuit development system based on a Xilinx Spartan-6 LX45 FPGA, speed grade 3. A 100 MHz crystal from this board serves as the frequency source to be compensated. A divider chain is implemented as a Johnson counter. It functions as the base time generator 420, created from the configurable FPGA elements. There are multiple PLLs available from this FPGA system as standard components. One of them is selected to function as the integer-N PLL 400 in our system. The TAF-DPS is also implemented from the configurable FPGA elements. The circuit for implementing this TAF-DPS is chosen as Flying-Adder frequency synthesis architecture [3]. In this particular case, the implementation approach is HDL coding→simulation→synthesis & map to FPGA. The VHDL code for this Flying-Adder circuit is available in Appendix 4.A of [3].

Figure 6:
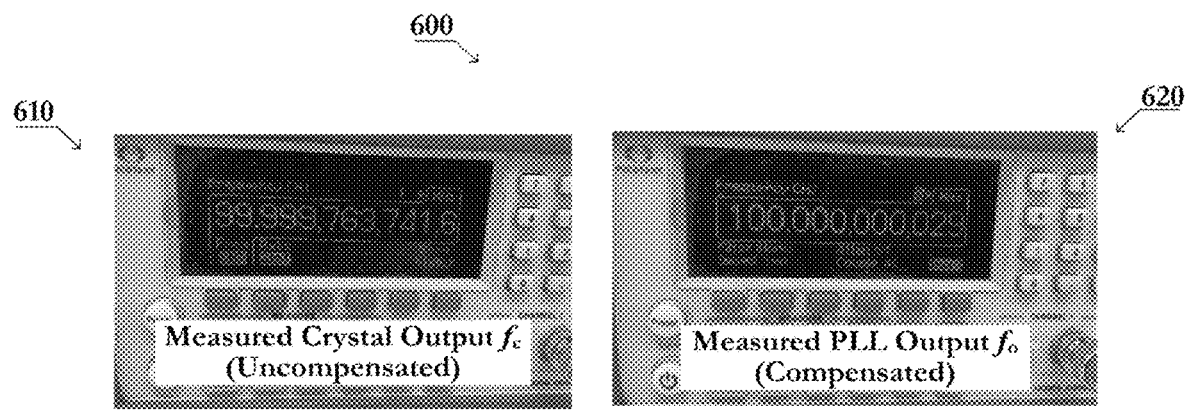
FIG. 6 is experimental data showing the result of using TAF-DPS frequency compensation scheme for improving a frequency source's frequency accuracy.

Referring now to FIG. 6, the present invention of improving a frequency source's frequency accuracy is demonstrated by experiment data. The 100 MHz crystal from said Atlys™ FPGA system board serves as the frequency source to be compensated. A PICOTEST® frequency counter is used to measure the frequencies of $f_i$ 511, $f_s$ 531 and $f_o$ 541. FIG. 6 is the screen captures of measured $f_i$ 511 and $f_o$ 541. As seen in the picture 610, the original crystal output $f_i$ 511 is measured as 99.9997637416 MHz. This is about 2.36 ppm slower than the target value of 100 MHz (x=2.362589581·10$^{-6}$). In our test, both I and M are set as 16. From (11), r is subsequently calculated as r=−0.00037801433296. Therefore, F=15.999962198566704 is inputted into TAF-DPS synthesizer 530. As seen in the picture 620, the final output after compensation $f_o$ 541 is measured 100.000000029 MHz. The accuracy is improved from 2.36 ppm to 0.29 ppb. This is an improvement of almost five orders of magnitude.

Figure 7:
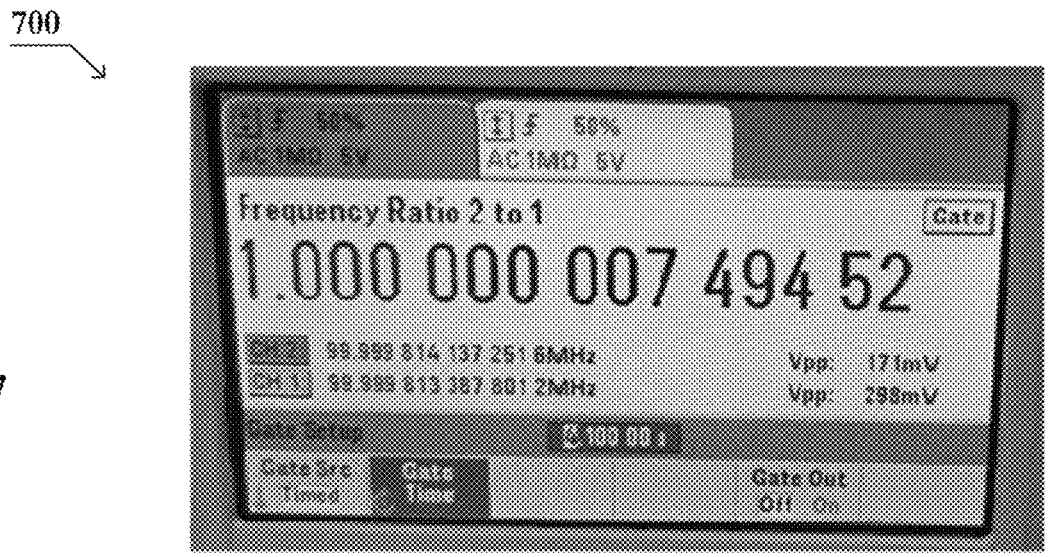
FIG. 7 is experimental data validating the equation used in TAF-DPS frequency compensation scheme.

Referring now to FIG. 7, an experiment data for validating equation (13) is presented. In this figure, screen capture 700 shows the configuration of $r=-2^{-24}$ and $F=I+r=16-2^{-24}$, which results in $f_o/f_c=1.0000000037253$ from using equation (13). The measured value, as displayed, is 1.0000000074945 which agrees well with the calculated one. The error is $3.77 \cdot 10^{-9}$. Table I gives test results of several other values, ranged from $2^{-24}$ to $2^{-4}$. The case of $2^{-24}$ demonstrates the capability for smaller frequency correction (3.7 ppb) while $2^{-4}$ is for large correction (0.39%). The $2^{nd}$ and $3^{rd}$ columns are the calculation and measured results, respectively. It is worth to mention that we only test to $2^{-4}$ since it is already 0.39% (3900 ppm), which is more than enough for most practical scenarios. From circuit perspective, however, TAF-DPS has much larger frequency tuning range.

TABLE I

Measured $f_o/f_c$ at Various Settings (I = 16, $f_{target}$ = 100 MHz)

| r | Control Word F | $f_o/f_c =1 +/- r/I$ (Calculated) | $f_o/f_c$ (Measured) |
|---|---|---|---|
| $2^{-24}$ | $16 + 2^{-24}$ | 0.9999999962747 | 0.9999999999421 |
|  | $16 - 2^{-24}$ | 1.0000000037253 | 1.0000000074945 |
| $2^{-20}$ | $16 + 2^{-20}$ | 0.9999999403954 | 0.9999999777260 |
|  | $16 - 2^{-20}$ | 1.0000000596046 | 1.0000000695398 |
| $2^{-16}$ | $16 + 2^{-16}$ | 0.9999990463260 | 0.9999990440000 |
|  | $16 - 2^{-16}$ | 1.0000009536740 | 1.0000019060000 |
| $2^{-8}$ | $16 + 2^{-8}$ | 0.9997558590000 | 0.9997559189052 |
|  | $16 - 2^{-8}$ | 1.0002441410000 | 1.0004885196137 |
| $2^{-4}$ | $16 + 2^{-4}$ | 0.9960937500000 | 0.9961089480000 |
|  | $16 - 2^{-4}$ | 1.0039062500000 | 1.0078740156180 |

Figure 8:
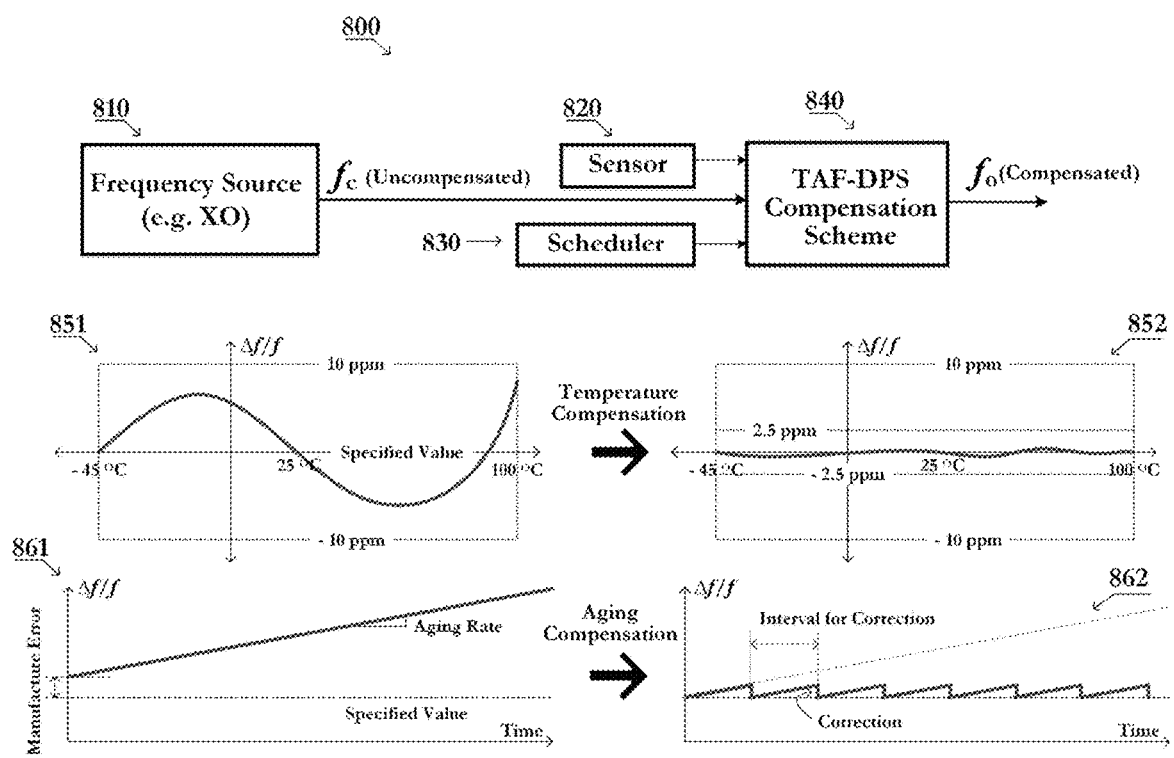
FIG. 8 is an electrical diagram, in block form, illustrating an embodiment of present invention of using TAF-DPS frequency compensation scheme for correcting frequency error caused by manufacture error and for compensating temperature-induced and aging-related frequency errors.

Referring now to FIG. 8, the system level application 800 of present invention to fulfill the task of frequency compensation will be described. Frequency source 810 (e.g. a crystal oscillator) is used as the frequency reference for an electronic system. In most times, its output frequency is not at the target value. Therefore, to improve system performance, its output needs to be frequency compensated. TAF-DPS compensation scheme 840 is used for this purpose. An embodiment of scheme 840 is system 500. In FIG. 8, scheduler 830 is used to schedule periodic frequency compensation tasks, such as counteracting ageing effect. Sensor 820 is used to sense the changes in operating environment, such as temperature change, so that corresponding action of frequency compensation can be performed.

Plot 851 illustrates an exemplary f vs. temperature curve for a crystal oscillator, for a temperature range from −45° C. to 100° C. Plot 852 depicts the output frequency from the application of present invention 800 of frequency compensation scheme. The same range of f vs. temperature curve is displayed. Comparing plot 851 and 852 it is seen that, after the application of present invention of frequency compensation scheme, the amount of frequency variation is significantly reduce. Plot 861 illustrates the f vs. time curve for a frequency source. In this plot, the frequency deviation due to manufacture error and the frequency drift due to ageing are depicted. Plot 862 shows the same f vs. time curve after the frequency source is compensated by present invention. As shown, the manufacture error related initial frequency deviation is measured first and then compensated using equation (13). In addition, the aging induced frequency error is periodically counteracted by our present invention in a scheduled interval. As a result, the frequency stability is much improved.

Method of Incorporating TAF-DPS Frequency Compensation Scheme Inside Chips

Figure 9:
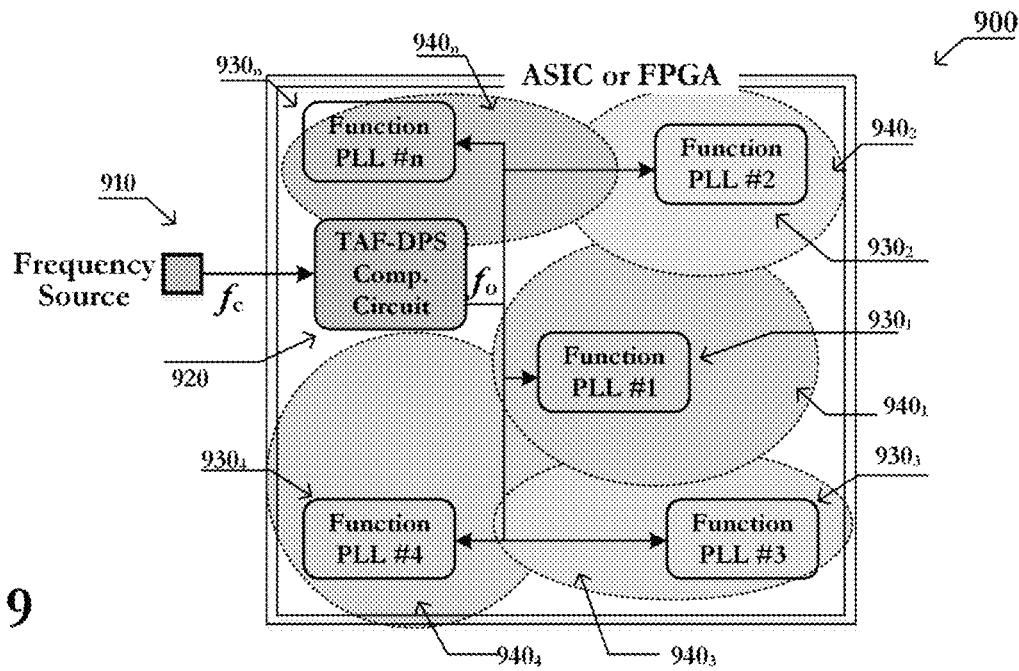
FIG. 9 is a block diagram illustrating an embodiment of present invention of incorporating TAF-DPS based frequency compensation scheme in System-on-Chip.

The present invention further relates to a method of incorporating the TAF-DPS based frequency compensation scheme inside functional chips. Such chip can be signal processing chip, communication chip, sensor chip, power management chip, general purpose CPU and etc. Refer now to FIG. 9, a functional SoC (system-on-chip) chip 900 is implemented in ASIC style or FPGA style. Inside chip 900, there are multiple function PLLs $930_1$, $930_2$, $930_3$, $930_4$, . . . , $930_n$. Each of said PLLs is used to drive its associated functional block $940_1$, $940_2$, $940_3$, $940_4$, . . . , $940_n$. Each of said functional blocks $940_1$, $940_2$, $940_3$, $940_4$, . . . , $940_n$ performs certain logic and/or arithmetic function.

Chip 900 uses a frequency source 910 as its frequency source. Frequency source 910 has a target frequency value for its operation. In real operating environment, 910 frequency source's output frequency $f_c$ usually is not at said target value. TAF-DPS compensation circuit 920 takes 910 source's output as its input and compensates any frequency deviation found in $f_c$. 920 TAF-DPS compensation circuit's output frequency $f_o$ is frequency compensated to the target value and it is subsequently used as the reference source for all said PLLs. The architecture of TAF-DPS compensation circuit 920 is described in architecture 500 (please refer to FIG. 5). Its circuit implementation style is aligned with that of functional chip. The implementation style can be either ASIC style or FPGA style. As a result, the TAF-DPS compensation circuit 920 is seamlessly integrated into the functional chip 900.

Figure 10:
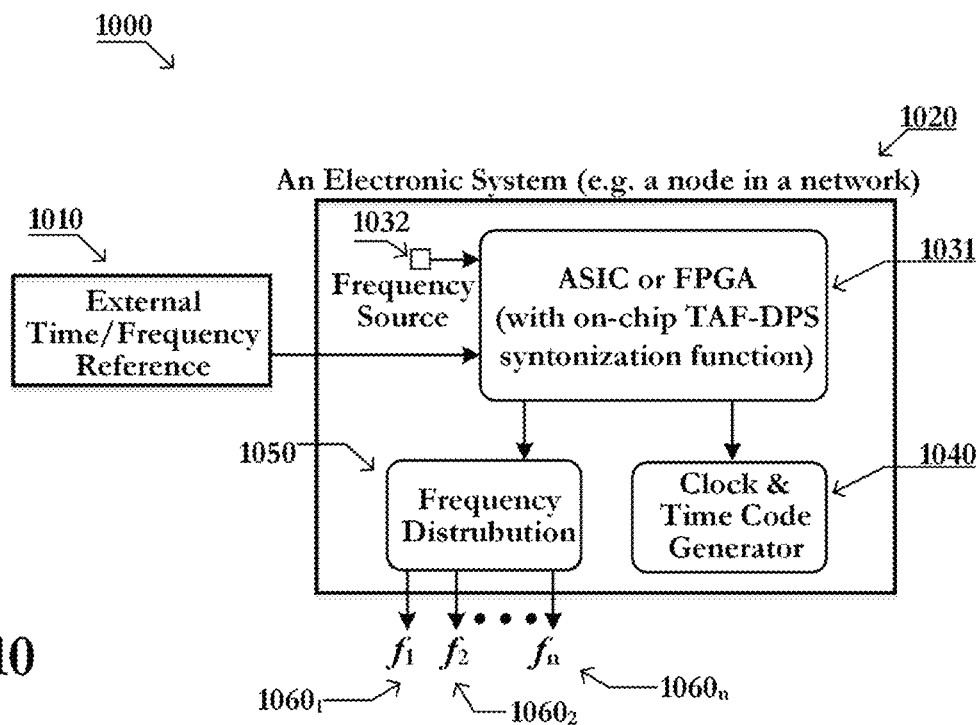
FIG. 10 is a block diagram illustrating an embodiment of present invention of using chips equipped with TAF-DPS frequency compensation scheme in an electronic network.
Figure 1:
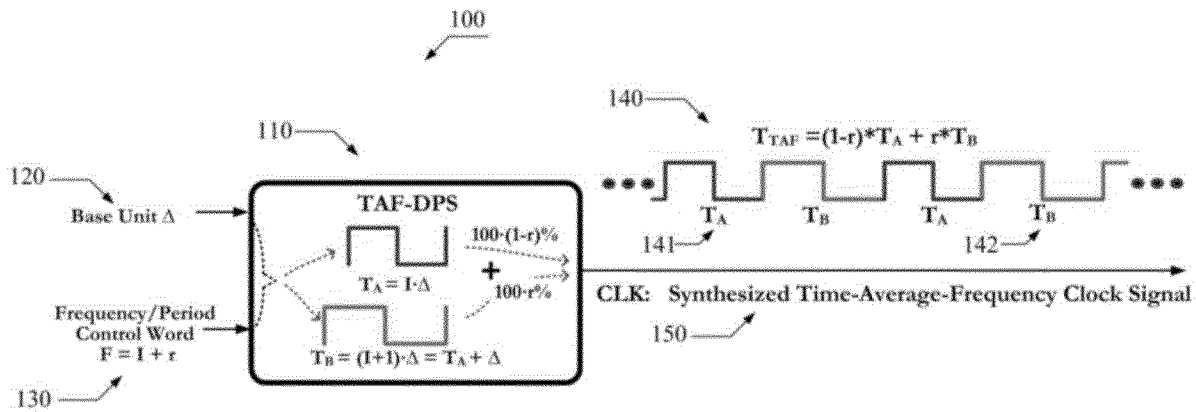
Figure 2:
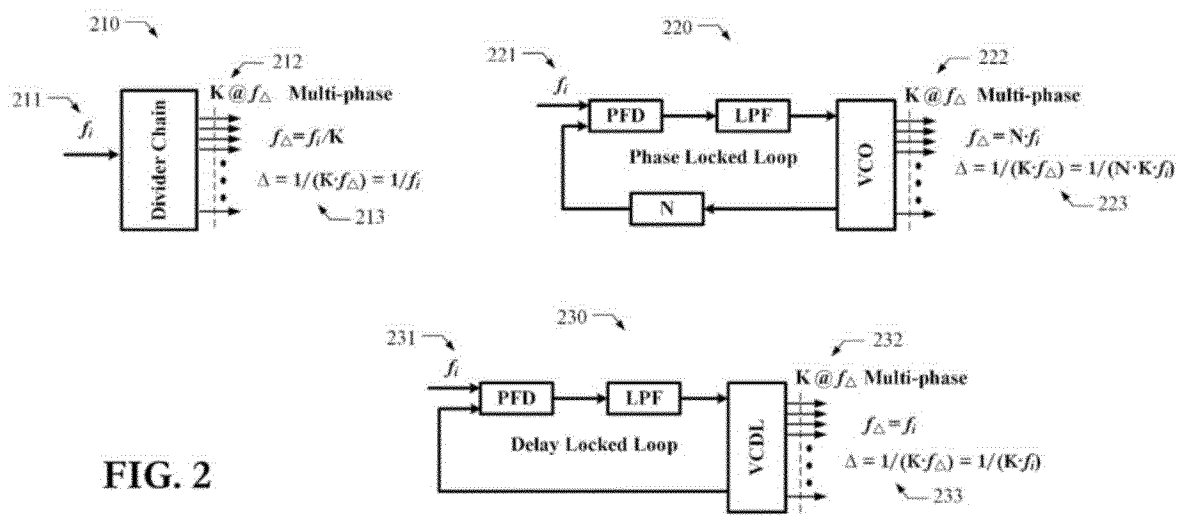
Figure 3:
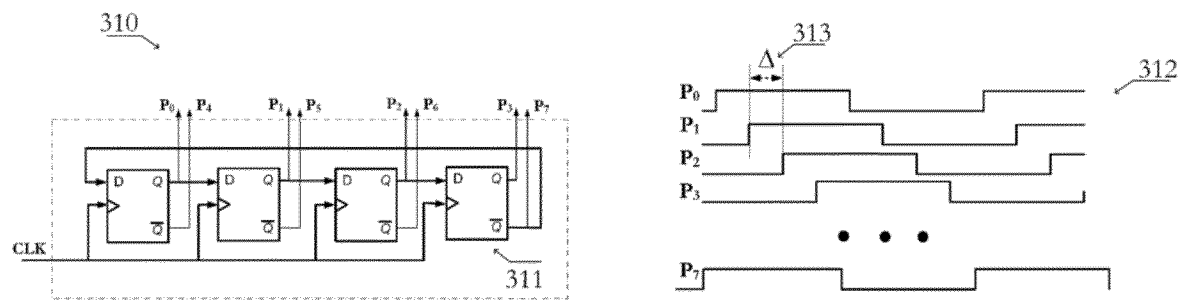
Figure 4:
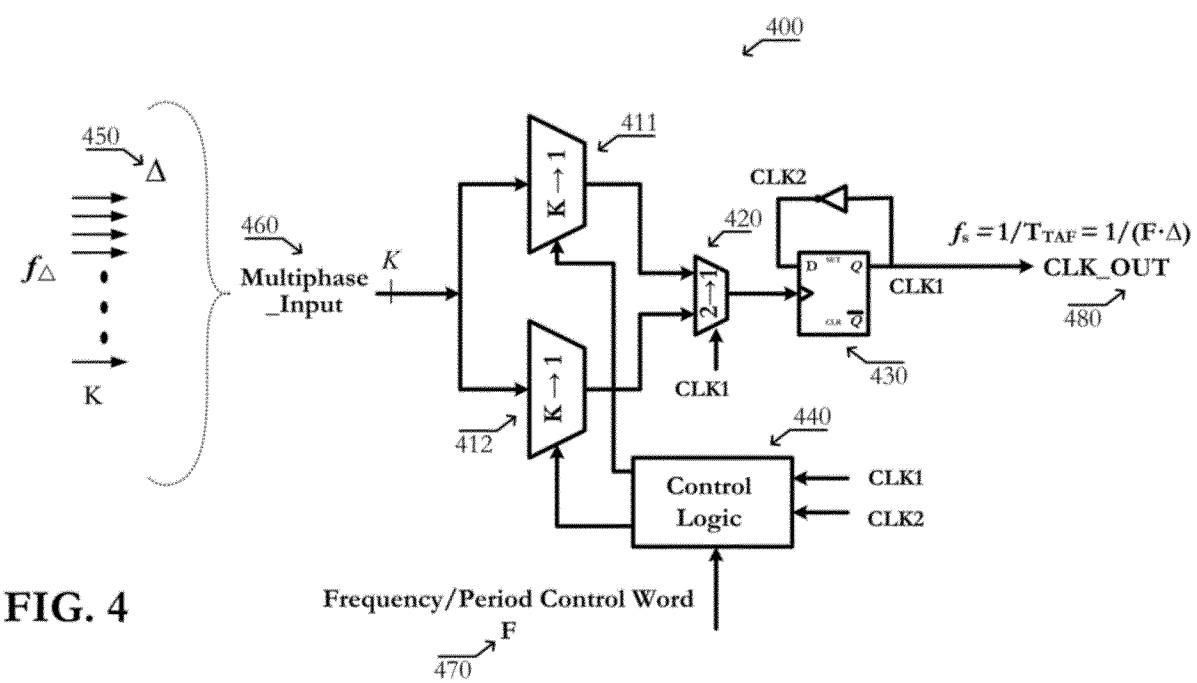
Figure 5:
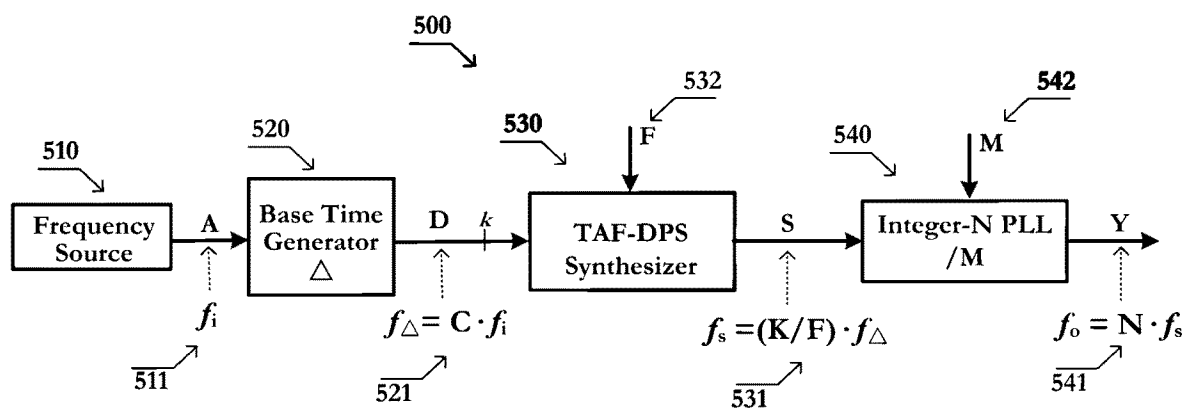
Figure 6:
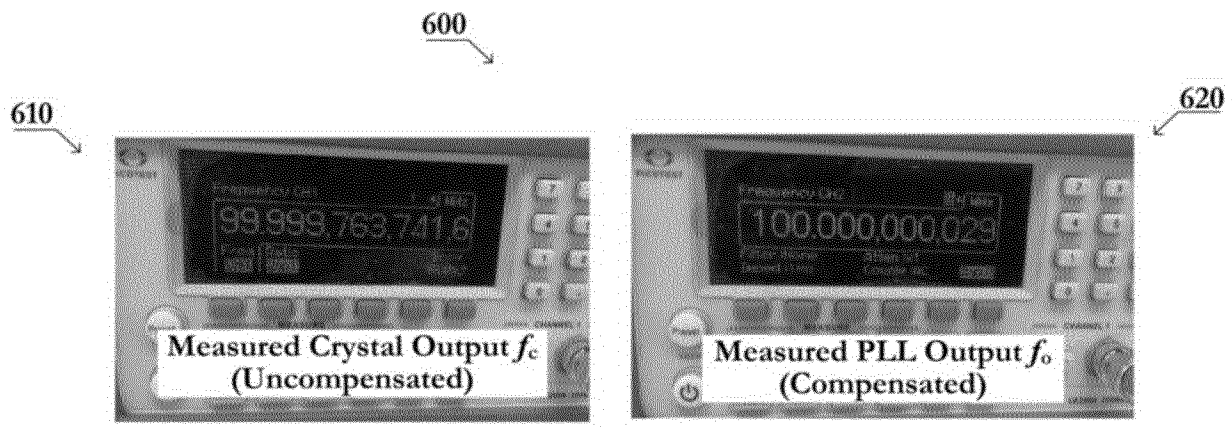
Figure 7:
Figure 8:
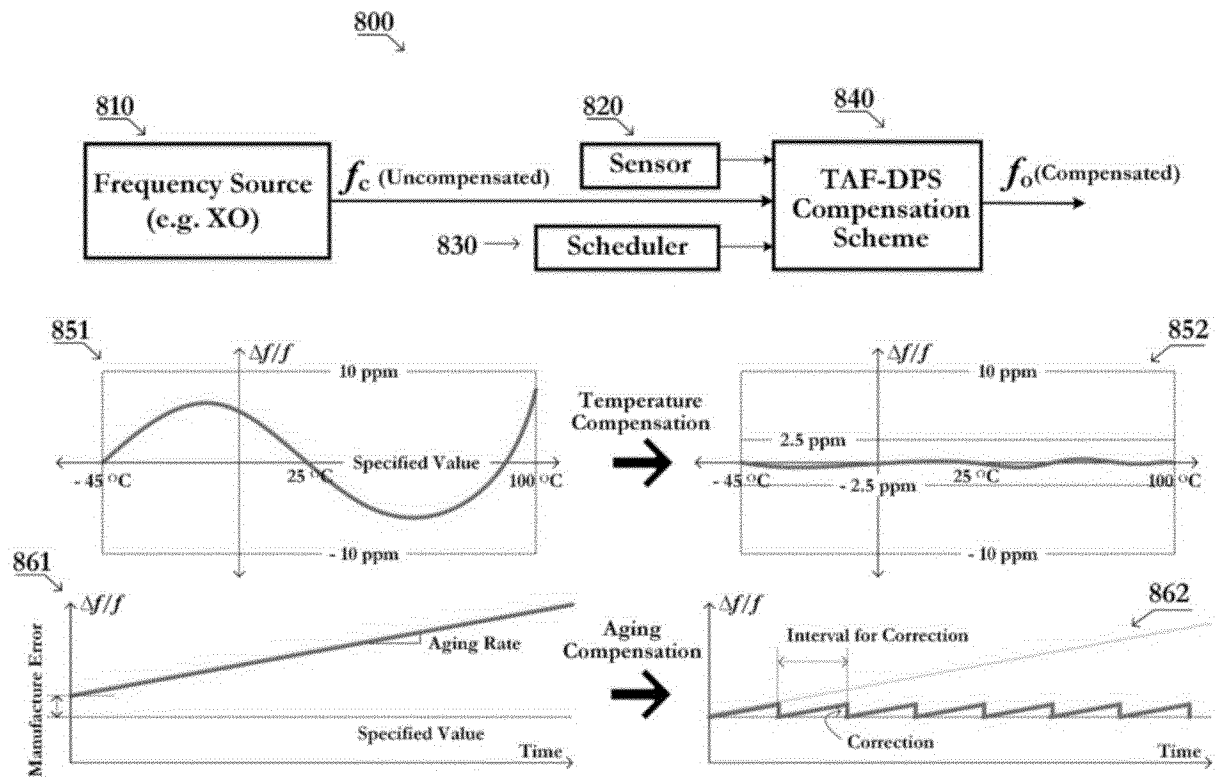
Figure 9:
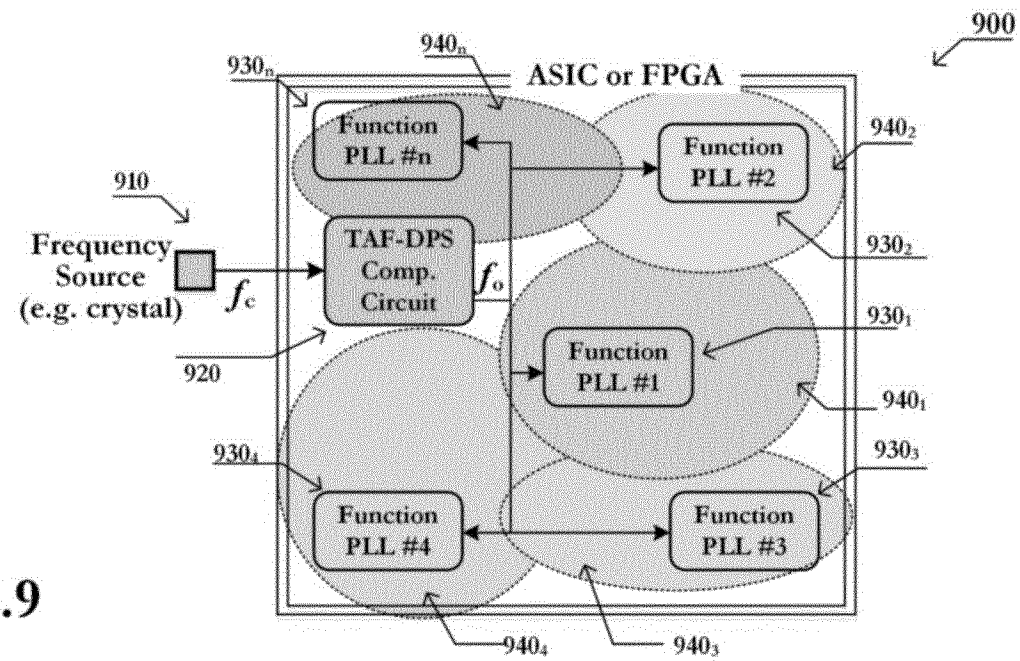
Figure 10:
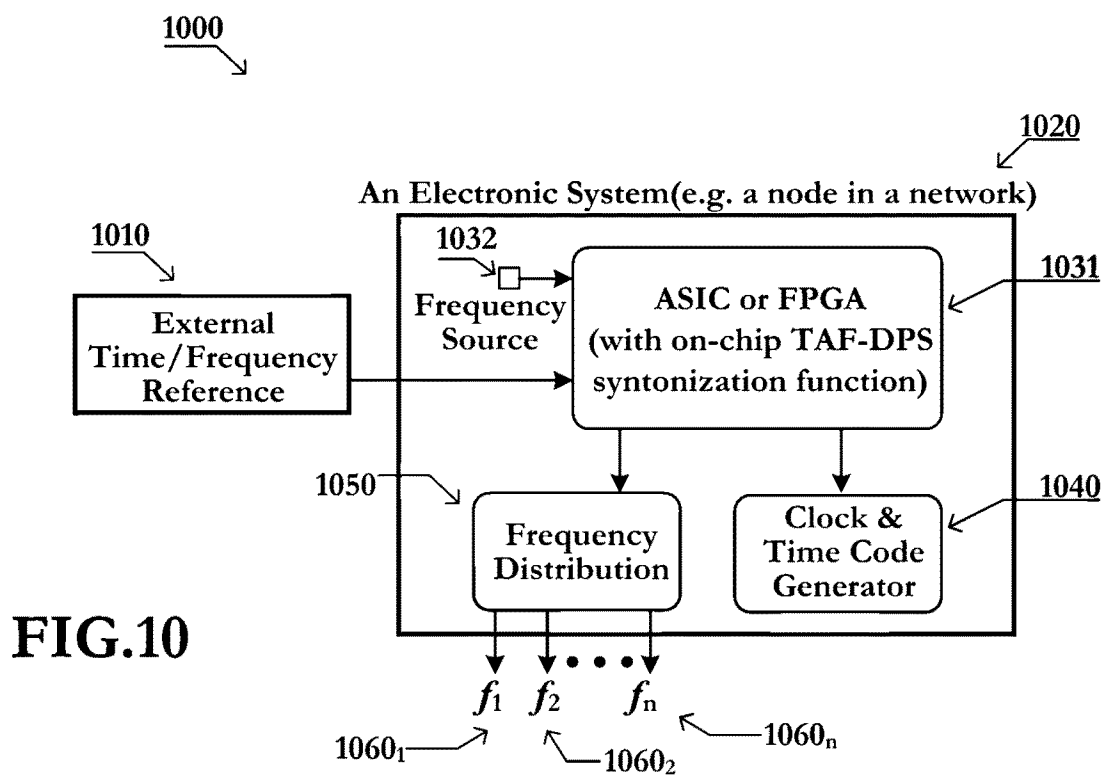

Method of Using TAF-DPS Frequency-Compensation-Scheme-Equipped-Chip in Network A TAF-DPS frequency-compensation-scheme-equipped-chip is an electronic system that includes the TAF-DPS frequency compensation scheme. The present invention further relates to a method of using TAF-DPS-frequency-compensation-scheme-equipped-chips as nodes in network for assisting network time synchronization. Refer now to FIG. 10, electronic device 1000 functions as a node in a network. Device 1000 comprises of an electronic system 1020 and a receiver system to receive a time and/or frequency reference 1010 which physically locates outside system 1020. System 1020 comprises of a chip 1031 that is equipped with TAF-DPS frequency compensation scheme, a frequency source 1032, a frequency distribution module 1050 and a clock and time code generator 1040. Chip 1031 can be implemented either in ASIC or FPGA style. Frequency source 1032 is used as the reference source for 1031 chip's all internal timing circuits such as PLLs. Chip 1031 and source 1032 are created using said method associated with FIG. 9.

Chip 1031 also takes output from the frequency reference 1010 as the "good" reference of higher frequency accuracy for comparing its internal time and frequency information with network time and frequency information. The resulting difference is used for 1031 chip's internal TAF-DPS frequency compensation scheme to compensate its frequency error. This task of comparing and compensation is carried out periodically in a prescheduled time interval. This task can also be performed at any time when necessary.

Using 1031 chip's internal timing circuit's output, such as a PLL supported by frequency source 1032 and calibrated by reference 1010, module 1040 generates a clock and time code for supporting 1020 system's operation. Frequency distribution module 1050 takes frequency information from chip 1031 and performs necessary operations and subsequently output frequencies $f_1$ 1060$_1$, $f_2$ 1060$_2$, ..., $f_n$ 1060$_n$ down the network hierarchy in hierarchical master-salve synchronization architecture. Frequencies $f_1$ 1060$_1$, $f_2$1060$_2$, ..., $f_n$ 1060$_n$ can also be sent to other nodes of the network in the mutual synchronization architecture. Since the frequency inside chip 1031 has been calibrated against reference 1010, the frequency accuracies of frequencies $f_1$ 1060$_1$, $f_2$1060$_2$, ..., $f_n$ 1060$_n$ are thus improved and hence their accuracies are better than that of frequency source 1032.

CONCLUSION/SUMMARY

Thus, the present invention provides TAF-DPS based circuits and methods to enhance electronic system's frequency accuracy and frequency stability. Present invention creates a circuit architecture and a scheme for compensating frequency source's frequency error. Present invention discloses a method of incorporating said scheme into processing chip. Present invention further presents a method for using TAF-DPS-frequency-compensation-scheme-equipped chips as nodes in electronic network. As a result, the circuit and apparatus disclosed in present invention can improve electronic system's performance.

The foregoing descriptions of specific embodiments of the present invention have been presented for the purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

[1] "Improving the Accuracy of a Crystal Oscillator," AN1200.07, available: www.semtech.com/images/datasheet/xo_precision_std.pdf, SEMTECH.

[2] L. Xiu, "The Concept of Time-Average-Frequency and Mathematical Analysis of Flying-Adder Frequency Synthesis Architecture," IEEE Circuit And System Magazine, 3rd quarter, pp. 27-51, September 2008.

[3] L. Xiu, *Nanometer Frequency Synthesis beyond Phase Locked Loop*," August 2012, John Wiley IEEE press.

[4] L. Xiu and P. L. Chen, "A Reconfigurable TAF-DPS Frequency Synthesizer on FPGA achieving 2 ppb Frequency Granularity and Two-Cycle Switching Speed," *IEEE Trans. on Industrial Electronics*, accepted, September 2016.

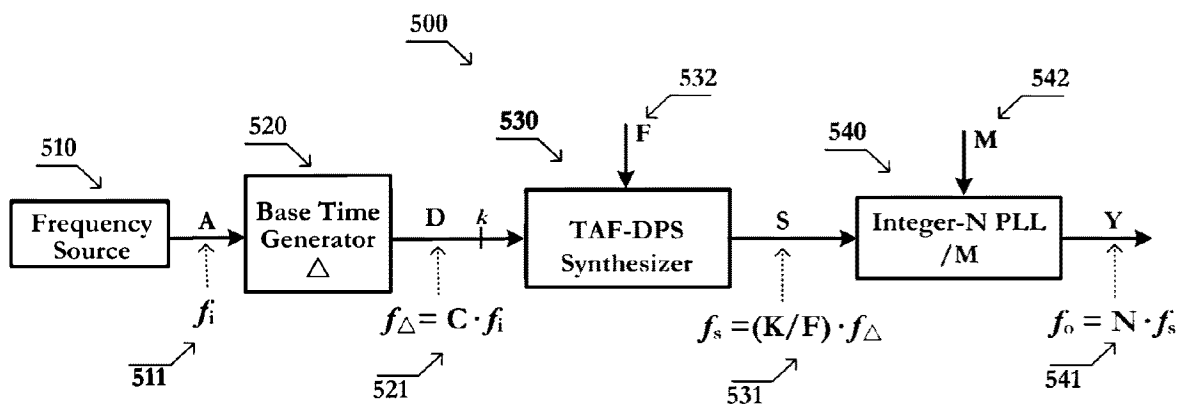

What is claimed is:

1. A frequency fine tune system, for improving frequency source's frequency accuracy and frequency stability, comprises:
a first input for receiving a first electrical pulse signal, said first electrical pulse signal having a first operating frequency value, said first electrical pulse signal having a target frequency value specified in its specification;
a second input for receiving a frequency control word, said frequency control word have both integer part and fractional part;
a third input for receiving a divide ratio word, said divide ratio word is an integer of greater than zero;
an output for delivering a second electrical pulse signal, said second electrical pulse signal having a second operating frequency value;
a base time unit generator, having an input for receiving said first electrical pulse signal, having an output for delivering a plurality of K phase-evenly-spaced-signals where K is an integer of greater than one;
a TAF-DPS frequency synthesizer, having a first input for receiving said frequency control word, having a second input for receiving said plurality of K phase-evenly-spaced-signals, having an output for delivering a synthesized electrical pulse signal;
a PLL (Phase Locked Loop), for generating said second electrical pulse signal, having a first input for receiving said divide ratio word, having a second input for receiving said synthesized electrical pulse, having an output for delivering said second electrical pulse signal.

2. The system of claim 1, wherein said second operating frequency value is closer to said target frequency value than first operating frequency value is to said target frequency value.

3. The system of claim 1, wherein said base time unit generator is created from a divider chain, said divider chain comprises a series of flip-flops clock driven by said first electrical pulse signal, said flip-flops are connected in series to form a loop, all non-inverting and inverting outputs from said flip-flops form said plurality of K phase-evenly-spaced-signals.

4. The system of claim 1, wherein said base time unit generator is created from a PLL, said PLL uses said first electrical pulse signal as its input reference, said PLL has a VCO (voltage control oscillator) having multiple stages, outputs from said stages form said plurality of K phase-evenly-spaced-signals.

5. The system of claim 1, wherein said base time unit generator is created from a DLL (Delay Locked Loop), said DLL uses said first electrical pulse signal as its input, said DLL has a VCDL (voltage controlled delay line) having multiple stages, outputs from said stages form said plurality of K phase-evenly-spaced-signals.

6. The system of claim 1, wherein said TAF-DPS frequency synthesizer comprises:
a first K→1 multiplexer, having a multi-bit input for receiving said plurality of K phase-evenly-spaced signals, having a control input, having an output;
a second K→1 multiplexer, having a multi-bit input for receiving said plurality of K phase-evenly-spaced signals, having a control input, having an output;
a 2→1 multiplexer, having a first input for receiving the output from said first K→1 multiplexer, having a second input for receiving the output from said second K→1 multiplexer, having a control input, having an output;
a toggle flip-flop for generating a pulse train, comprises:
a D-type flip-flop, having a clock input for receiving output from the output of said 2→1 multiplexer, having a data input, having an output for outputting a CLK1 signal;
an inverter, having an input for receiving said CLK1 signal, having an output for outputting a CLK2 signal;

wherein said CLK2 signal is connected to said data input of said D-type flip-flop;
wherein said CLK1 signal contains said pulse train;
a control logic block, having a first input for receiving said frequency control word, having a second input for receiving said CLK1 signal, having a third input for receiving said CLK2 signal, having a first output connected to said control input of said first K→1 multiplexer, having a second output connected to said control input of said second K→1 multiplexer;
wherein said CLK1 signal is connected to said control input of said 2→1 multiplexer;
wherein said CLK1 signal is outputted as said synthesized electrical pulse signal.

7. The system of claim 1, wherein said PLL comprises:
a phase detector having a first input receiving said synthesized electrical pulse signal from said TAF-DPS frequency synthesizer and a second input receiving a feedback signal, for producing an error signal at an output corresponding to a phase and frequency difference between said synthesized electrical pulse signal and feedback signal;
a filter for low-pass filtering the error signal;
a frequency divider, having a first input receiving said divide ratio word, having a second input receiving a clock signal, and an output coupled to the phase detector as the feedback signal;
a voltage-controlled oscillator for generating an output at a frequency selected by the filtered error signal, said output is connected to the second input of said frequency divider, having an output for delivering said output from said voltage-controlled oscillator as said second electrical pulse signal.

8. A method of incorporating TAF-DPS frequency compensation scheme in functional chip, comprising the steps of:
creating a subsystem of TAF-DPS frequency compensation scheme in said functional chip, said subsystem is created using same implementation style as that used for creating said functional chip, said subsystem having a first input for receiving a first electrical pulse signal having a specified target frequency value $f_{target}$, said subsystem having a second input for receiving a frequency control word F=I+r where I is an integer of greater than one and r is a fraction of |r|≤0.5, said subsystem having a third input for receiving a divide ratio M where M is an integer of greater than zero, said subsystem having an output for delivering a second electrical pulse signal;
receiving a frequency reference for said functional chip, said frequency reference is an electrical pulse train of certain frequency;
creating a plurality of timing circuits for generating clock signals, said timing circuits can be PLL, said timing circuits can be DLL, each said timing circuit having an input for receiving an electrical pulse signal as input reference, said clock signals are used to drive functional circuits of said functional chip;
creating a calculation method, for determining the value of said frequency control word and the value of said divide ratio;
connecting said frequency reference to said first input of said subsystem;
connecting said output of said subsystem to said inputs of said timing circuits.

9. The method of claim 8, wherein the creating of subsystem of TAF-DPS frequency compensation scheme comprises the steps of:
creating a base time unit from a plurality of K phase-evenly-spaced signals where K is an integer of greater than one, said base time unit having an input for receiving said first electrical pulse signal, said base time unit having an output;
creating a TAF-DPS frequency synthesizer, said synthesizer having a first input for receiving said frequency control word F, said synthesizer having a second input coupled to said output of said base time unit, said synthesizer having an output;
creating a PLL, said PLL having a first input for receiving said divide ratio M, said PLL having a second input coupled to said output of TAF-DPS frequency synthesizer, said PLL having an output for delivering said second electrical pulse signal.

10. The method of claim 9, wherein the creating of base time unit comprises the steps of:
receiving said first electrical pulse signal;
creating a series of flip-flops;
connecting said series of flip-flops as a loop;
driving said series of flip-flops by using said first electrical pulse signal as clock signal;
outputting all non-inverting and inverting outputs from said flip-flops as said plurality of K phase-evenly-spaced signals, time span between any two logically adjacent signals from said plurality of K phase-evenly-spaced signals is the base time unit.

11. The method of claim 9, wherein the creating of base time unit comprises the steps of:
receiving said first electrical pulse signal;
creating a PLL circuit, said PLL having a multiple-delay-stage VCO (Voltage-Controlled Oscillator);
locking said PLL to said first electrical pulse signal;
configuring said PLL to generate a plurality of outputs from said multiple-delay-stage VCO;
outputting said plurality of outputs from said PLL as said plurality of K phase-evenly-spaced signals, time span between any two logically adjacent signals from said plurality of K phase-evenly-spaced signals is the base time unit.

12. The method of claim 9, wherein the creating of base time unit comprises the steps of:
receiving said first electrical pulse signal;
creating a DLL circuit, said DLL having a multiple-delay-stage VCDL;
locking said DLL to said first electrical pulse signal;
configuring said DLL to generate a plurality of outputs from said VCDL;
outputting said plurality of outputs from said DLL as said plurality of K phase-evenly-spaced signals, time span between any two logically adjacent signals from said plurality of K phase-evenly-spaced signals is the base time unit.

13. The method of claim 8, wherein the creating of said calculation method comprises the steps of:
measuring frequency of said first electrical pulse signal and recording it as comparing $f_i$ with its specified target value $f_{target}$, determining required amount of frequency correction x using equation $x=f_{target}/f_i-1$;
selecting a value for integer part of said frequency control word F as I, said integer I is selected from range of 2≤I≤2K;
setting a value for fraction r of said frequency control word F according to equation $r=-x \cdot I$;

feeding said F=I+r value into said subsystem of TAF-DPS frequency compensation scheme as said second input;
setting a value for integer M of said divide ratio according to equation M=I;
feeding said value of M into said subsystem of TAF-DPS frequency compensation scheme as said third input.

14. The method of claim 8, wherein the creating of said calculation method comprises the steps of:
measuring frequency of said first electrical pulse signal and recording it as $f_i$, comparing $f_i$ with its specified target value $f_{target}$, determining required amount of frequency correction x using equation $x=f_{target}/f_i-1$;
selecting a value for integer part of said frequency control word F as I, said integer I is selected from range of 2≤I≤2K;
selecting a value for fraction r of said frequency control word F according to equation $r=(I/2)(1-\sqrt{1+4x})$;
feeding said F=I+r value into said subsystem of TAF-DPS frequency compensation scheme as said second input;
setting a value for integer M of said divide ratio according to equation M=I;
feeding said value of M into said subsystem of TAF-DPS frequency compensation scheme as said third input.

15. The method of claim 8, wherein the creating of said calculation method comprises the steps of:
measuring frequency of said first electrical pulse signal and recording it as $f_i$, comparing $f_i$ with its specified target value $f_{target}$, determining required amount of frequency correction x using equation $x=f_{target}/f_i-1$;
selecting a value for integer part of said frequency control word F as I, said integer I is selected from range of 2≤I≤2K;
setting a value for integer M of said divide ratio as M=L;
setting a value for fraction r of said frequency control word F according to equation $r=I-(I^2/L)\cdot(1+x)$;
feeding said F=I+r value into said subsystem of TAF-DPS frequency compensation scheme as said second input;
feeding said value of M into said subsystem of TAF-DPS frequency compensation scheme as said third input.

16. A method of using TAF-DPS-frequency-compensation-scheme-equipped chips as nodes in network, for assisting network time synchronization, comprises the steps of:
creating electronic systems, for being used as nodes in an electronic network, said network having need for time synchronization among its member nodes, each said electronic systems having an input for receiving an external reference of time and frequency information;
incorporating a plurality of TAF-DPS-frequency-compensation-scheme-equipped chips in each said electronic system;
calibrating each said electronic system's internal timing circuits in a scheduled time interval or in any time desired by user of said systems by using said external reference as reference for calibration, said calibration task is carried out through TAF-DPS frequency compensation scheme incorporated in said TAF-DPS-frequency-compensation-scheme-equipped chips.

17. The method of claim 16, wherein each said electronic system has an output for delivering a plurality of signals with individually controlled frequency values.

18. The method of claim 17, wherein each said electronic system outputs a plurality of signals with individually controlled frequency values from said output for transferring frequencies to other nodes in said network, said signals are generated from said electronic system' internal timing circuits.

19. The method of claim 16, wherein creating said electronic system of said electronic systems comprises the steps of:
receiving said external reference from said input;
receiving an internal frequency reference from a frequency source;
creating a plurality of functional chips in ASIC style, for performing signal processing tasks, incorporating TAF-DPS frequency compensation scheme in each said functional chips, driving functional circuits of each said functional chips by clock signals, generating said clock signals from internal timing circuits, said timing circuits are frequency referenced to said internal frequency reference;
creating a calibration mechanism by comparing time and frequency information of said external reference to that of internal timing circuit, for correcting time and frequency error found between said external reference and internal timing circuit;
creating a frequency distribution module, for delivering signals of calibrated frequency values to other nodes in said network, said signals are generated from said internal timing circuit;
creating a clock and time code generator, for generating internal timing of said electronic system, for supporting internal operation of said electronic system.

20. The method of claim 16, wherein creating said electronic system comprises the steps of:
receiving said external reference from said input;
receiving an internal frequency reference from a frequency source;
creating a plurality of functional chips in FPGA style, for performing signal processing tasks, incorporating TAF-DPS frequency compensation scheme in each said functional chips, driving functional circuits of each said functional chips by clock signals, generating said clock signals from internal timing circuits, said timing circuits are frequency referenced to said internal frequency reference;
creating a calibration mechanism by comparing time and frequency information of said external reference to that of internal timing circuit, for correcting time and frequency error found between said external reference and internal timing circuit;
creating a frequency distribution module, for delivering signals of calibrated frequency values to other nodes in said network, said signals are generated from said internal timing circuit;
creating a clock and time code generator, for generating internal timing of said electronic system, for supporting internal operation of said electronic system.

* * * * *

UNITED STATES PATENT AND TRADEMARK OFFICE
CERTIFICATE OF CORRECTION

PATENT NO. : 10,686,458 B1
APPLICATION NO. : 15/665579
DATED : June 16, 2020
INVENTOR(S) : Liming Xiu Page 1 of 9

It is certified that error appears in the above-identified patent and that said Letters Patent is hereby corrected as shown below:

On the Title Page

Under abstract "20 Claims, 5 Drawing Sheets" should read --20 Claims, 7 Drawing Sheets-- as shown on the attached title page.

Delete the title page and substitute therefore with the attached title page consisting of the corrected illustrative figure.

In the Drawings

Please replace FIGS. 1-10 with FIGS. 1-10 as shown on the attached pages.

Signed and Sealed this
Twenty-third Day of March, 2021

Drew Hirshfeld
*Performing the Functions and Duties of the
Under Secretary of Commerce for Intellectual Property and
Director of the United States Patent and Trademark Office*

(12) United States Patent
Xiu

(10) Patent No.: US 10,686,458 B1
(45) Date of Patent: Jun. 16, 2020

(54) METHOD AND APPARATUS FOR IMPROVING FREQUENCY SOURCE FREQUENCY ACCURACY AND FREQUENCY STABILITY

(71) Applicant: Liming Xiu, Plano, TX (US)

(72) Inventor: Liming Xiu, Plano, TX (US)

(73) Assignee: Liming Xiu, Plano, TX (US)

(*) Notice: Subject to any disclaimer, the term of this patent is extended or adjusted under 35 U.S.C. 154(b) by 0 days.

(21) Appl. No.: 15/665,579

(22) Filed: Aug. 1, 2017

(51) Int. Cl.
| H03K 4/26 | (2006.01) |
| H03L 7/18 | (2006.01) |
| H03L 7/099 | (2006.01) |
| H03L 7/093 | (2006.01) |

(52) U.S. Cl.
CPC ............ *H03L 7/18* (2013.01); *H03L 7/093* (2013.01); *H03L 7/099* (2013.01)

(58) Field of Classification Search
USPC .................................. 327/107–112
See application file for complete search history.

(56) References Cited

U.S. PATENT DOCUMENTS

| 6,104,252 A * | 8/2000 | Hofmann | H03L 1/026 327/105 |
| 6,329,850 B1 * | 12/2001 | Mair | G06F 1/025 327/105 |
| 7,065,172 B2 * | 6/2006 | Xiu | H03L 7/0996 327/147 |
| 7,406,144 B2 * | 7/2008 | Wang | H03C 3/0966 327/158 |
| 7,764,131 B1 * | 7/2010 | Seth | H03L 1/027 327/298 |
| 7,772,893 B2 * | 8/2010 | Chen | H03K 5/15013 327/105 |
| 8,120,389 B2 * | 2/2012 | Xiu | G06F 1/025 327/105 |
| 8,135,103 B1 * | 3/2012 | Courcy | H03L 7/197 348/537 |
| 8,664,988 B1 * | 3/2014 | Xiu | H03L 7/081 327/147 |
| 8,890,591 B1 * | 11/2014 | Xiu | H03L 1/022 327/147 |
| 9,054,921 B2 * | 6/2015 | Mayer | H04L 27/362 |
| 9,118,275 B1 * | 8/2015 | Xiu | G06F 1/08 |
| 9,379,714 B1 * | 6/2016 | Xiu | G04F 10/005 |
| 9,571,083 B2 * | 2/2017 | Rapinoja | H03K 5/159 |
| 9,621,173 B1 * | 4/2017 | Xiu | H03L 7/197 |
| 2003/0003887 A1 * | 1/2003 | Lim | H03L 7/085 455/147 |

(Continued)

*Primary Examiner* — Adam Houston

(57) ABSTRACT

A TAF-DPS based circuits and methods to improve electronic system's frequency accuracy and enhance its frequency stability is disclosed in this application. Present invention creates a circuit architecture and a calculation scheme for compensating frequency source's frequency error. Present invention further discloses a method of incorporating said scheme into functional chip built in either ASIC or FPGA fashion. Present invention further presents a method of using TAF-DPS-frequency-compensation-scheme-equipped-chips as nodes in electronic network. As a result, the circuit and apparatus disclosed in present invention can improve electronic system's performance from the time synchronization perspective.

20 Claims, 7 Drawing Sheets